United States Patent
Liaw (10) Patent No.: US 9,595,475 B2
(45) Date of Patent: Mar. 14, 2017

(54) MULTI-STAGE FIN FORMATION METHODS AND STRUCTURES THEREOF

(71) Applicant: TAIWAN SEMICONDUCTOR MANUFACTURING COMPANY, LTD., Hsin-Chu (TW)

(72) Inventor: Jhon Jhy Liaw, Zhudong Township, Hsinchu County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/556,908

(22) Filed: Dec. 1, 2014

(65) Prior Publication Data

US 2016/0155670 A1 Jun. 2, 2016

(51) Int. Cl.
*H01L 21/8234* (2006.01)
*H01L 21/308* (2006.01)
*H01L 29/66* (2006.01)
*H01L 27/088* (2006.01)
*H01L 29/06* (2006.01)

(52) U.S. Cl.
CPC .. *H01L 21/823431* (2013.01); *H01L 21/3086* (2013.01); *H01L 21/823481* (2013.01); *H01L 27/0886* (2013.01); *H01L 29/0649* (2013.01); *H01L 29/6656* (2013.01)

(58) Field of Classification Search
CPC ............................................. H01L 21/823431
See application file for complete search history.

(56) References Cited

U.S. PATENT DOCUMENTS

| | | | |
|---|---|---|---|
| 7,141,856 B2 | 11/2006 | Lee et al. | |
| 8,501,607 B1* | 8/2013 | Juengling | H01L 29/66795 438/587 |
| 9,105,478 B2* | 8/2015 | Wei | H01L 21/3086 |
| 9,142,641 B1* | 9/2015 | Lin | H01L 29/6656 |
| 9,268,896 B1* | 2/2016 | Tang | G06F 17/5072 |
| 2011/0127610 A1 | 6/2011 | Lee et al. | |
| 2013/0277720 A1* | 10/2013 | Kim | H01L 29/785 257/288 |
| 2015/0236133 A1* | 8/2015 | Singh | H01L 29/66795 257/401 |

FOREIGN PATENT DOCUMENTS

| | | |
|---|---|---|
| JP | 2006351975 | 12/2006 |
| KR | 200580017584 | 2/2005 |

* cited by examiner

*Primary Examiner* — Lex Malsawma
(74) *Attorney, Agent, or Firm* — Haynes and Boone, LLP (57) ABSTRACT

A method for fabricating a semiconductor device having a multi-stage fin profile includes providing a substrate and forming a first spacer having a first spacer width over the substrate. The first spacer masks a first portion of the substrate during a first etch process. By way of example, the first etch process is performed on the substrate to form a first-stage fin region, where a width of the first-stage fin region is substantially equal to about the first spacer width. A second spacer having a second spacer width is formed over the substrate, where the second spacer and the first-stage fin region mask a second portion of the substrate during a second etch process. In some examples, the second etch process is performed on the substrate to form a second-stage fin region, where a width of the second-stage fin region is greater than the width of the first-stage fin region.

20 Claims, 9 Drawing Sheets

MULTI-STAGE FIN FORMATION METHODS AND STRUCTURES THEREOF

BACKGROUND

The electronics industry has experienced an ever increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

Recently, multi-gate devices have been introduced in an effort to improve gate control by increasing gate-channel coupling, reduce OFF-state current, and reduce short-channel effects (SCEs). One such multi-gate device that has been introduced is the fin field-effect transistor (FinFET). The FinFET gets its name from the fin-like structure which extends from a substrate on which it is formed, and which is used to form the FET channel. FinFETs are compatible with conventional complementary metal-oxide-semiconductor (CMOS) processes and their three-dimensional structure allows them to be aggressively scaled while maintaining gate control and mitigating SCEs. However, continued scaling of FinFET devices has also led to issues such as increased difficulty for deployment of strained layers on narrow fin structures, as well as a reduced contact landing margin and increased contact resistance. In addition, for FinFET devices having a one-step fin profile, it may be challenging to provide well control due to the disparate requirements of a tapered fin profile (e.g., straight near the top of the fin and rounded near the bottom of the fin). While two-step fin profiles may address some of the above issues, conventional patterning of two-step fin profiles includes patterning of critical features using photolithographic techniques. As is well-known, photolithography processes are limited in their alignment precision, and repeatability, of the equipment used (e.g., a photolithography stepper). Thus, FinFET critical dimensions (CDs) may be directly impacted by misalignment of critical features during photolithography. Moreover, alignment errors can lead to degraded device performance and/or device failure. Thus, existing techniques have not proved entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is also noted that the present disclosure presents embodiments in the form of multi-gate transistors or fin-type multi-gate transistors referred to herein as FinFET devices. Such a device may include a P-type metal-oxide-semiconductor FinFET device or an N-type metal-oxide-semiconductor FinFET device. The FinFET device may be a dual-gate device, tri-gate device, bulk device, silicon-on-insulator (SOI) device, and/or other configuration. One of ordinary skill may recognize other examples of semiconductor devices that may benefit from aspects of the present disclosure. For example, some embodiments as described herein may also be applied to gate-all-around (GAA) devices, Omega-gate (Ω-gate) devices, or Pi-gate (Π-gate) devices.

Figure 1:
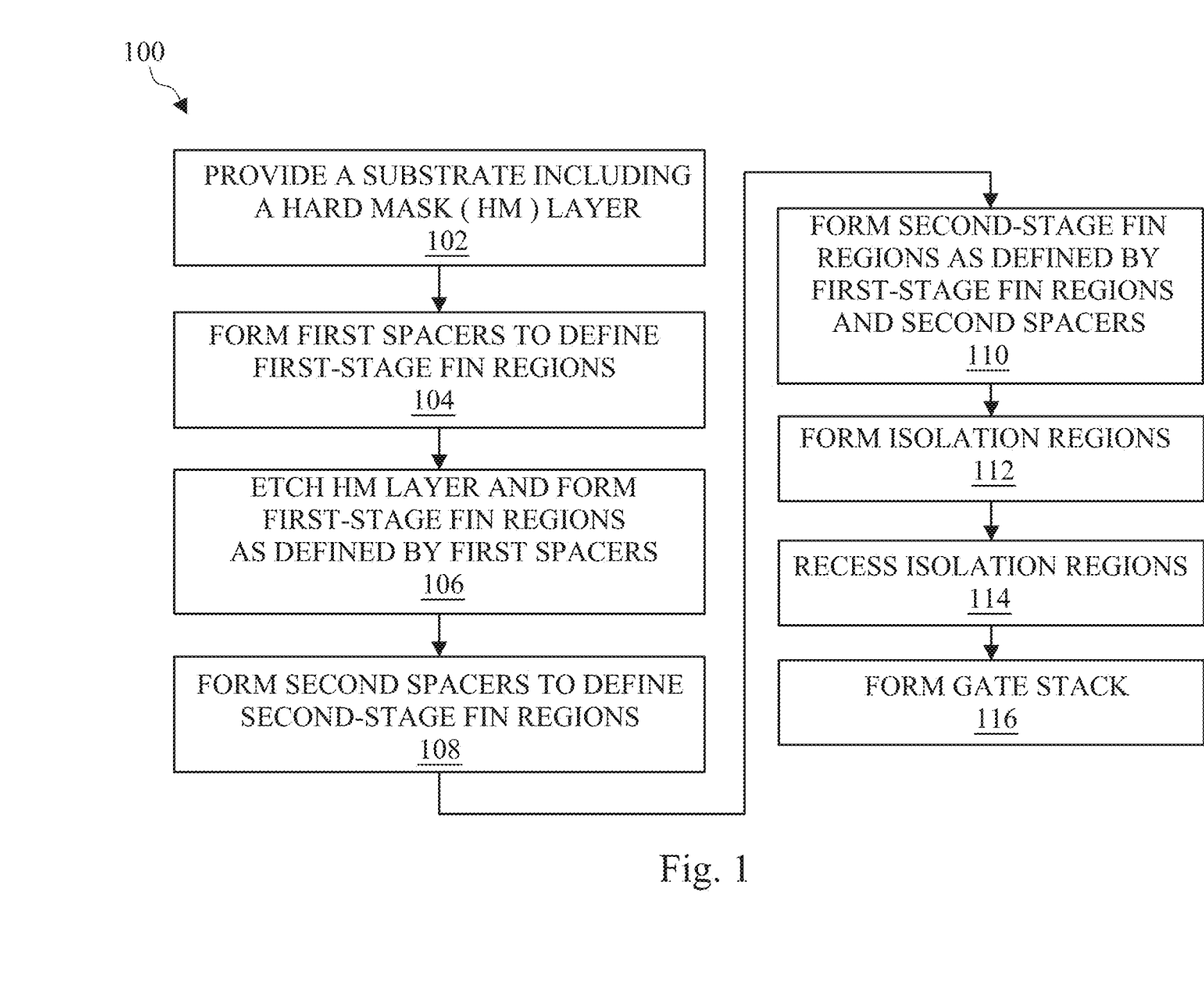
FIG. 1 is a flow chart of a method of fabricating a FinFET device or portion thereof according to one or more aspects of the present disclosure.

Illustrated in FIG. 1 is a method 100 of semiconductor fabrication including fabrication of self-aligned, multi-stage fins disposed on a substrate. As used herein, the term "self-aligned" or "self-aligned process" is used to describe a process by which an already existing substrate feature is used as a mask to pattern a subsequent layer or feature. For example, a conventional self-aligned gate process includes use of a transistor gate stack as a mask for subsequent formation of adjacent source/drain features (e.g., formed via ion implantation) on either side of the gate stack. As device geometries continue to scale down, photolithographic processes become increasingly challenging. For instance, photolithography processes may be limited in their alignment precision, and repeatability, of the equipment used (e.g., a photolithography stepper). As such, photolithographic patterning of FinFET critical dimensions (CDs) may be directly impacted by misalignment of critical features during photolithographic processes. Embodiments of the present disclosure, as discussed below, utilize one or more self-aligned processes in the formation of FinFET devices to mitigate at least some of the problems associated with lithographic patterning of highly-scaled structures and devices. It is understood that the method 100 includes steps having features of a complementary metal-oxide-semiconductor (CMOS) technology process flow and thus, are only described briefly herein. Additional steps may be performed before, after, and/or during the method 100.

FIGS. 2-13 are cross-sectional views of an embodiment of a semiconductor device 200 according to various stages of the method 100 of FIG. 1. It is understood that parts of the semiconductor device 200 may be fabricated by a CMOS technology process flow, and thus some processes are only briefly described herein. Further, the semiconductor device 200 may include various other devices and features, such as other types of devices such as additional transistors, bipolar junction transistors, resistors, capacitors, inductors, diodes, fuses, static random access memory (SRAM) and/or other logic circuits, etc., but is simplified for a better understanding of the inventive concepts of the present disclosure. In some embodiments, the semiconductor device 200 includes a plurality of semiconductor devices (e.g., transistors), including PFETs, NFETs, etc., which may be interconnected. Moreover, it is noted that the process steps of method 100, including any descriptions given with reference to FIGS. 2-13, are merely exemplary and are not intended to be limiting beyond what is specifically recited in the claims that follow.

The method 100 begins at block 102 where a substrate including a hard mask layer is provided. Referring to the example of FIG. 2, in an embodiment of block 102, a substrate 202 is provided. In some embodiments, the substrate 202 may be a semiconductor substrate such as a silicon substrate. The substrate 202 may include various layers, including conductive or insulating layers formed on a semiconductor substrate. The substrate 202 may include various doping configurations depending on design requirements as is known in the art. The substrate 202 may also include other semiconductors such as germanium (Ge), silicon carbide (SiC), silicon germanium (SiGe), or diamond. Alternatively, the substrate 202 may include a compound semiconductor and/or an alloy semiconductor. By way of example, in some embodiments, the substrate 202 may also include silicon phosphide (SiP), silicon phosphorus carbide (SiPC), a silicon-on-insulator (SOI) structure, a SiGe-on-SOI structure, a Ge-on-SOI structure, a III-VI material, or a combination of any of the above materials. Further, the substrate 202 may optionally include an epitaxial layer (epi-layer), may be strained for performance enhancement, and/or have other suitable enhancement features.

Figure 2:
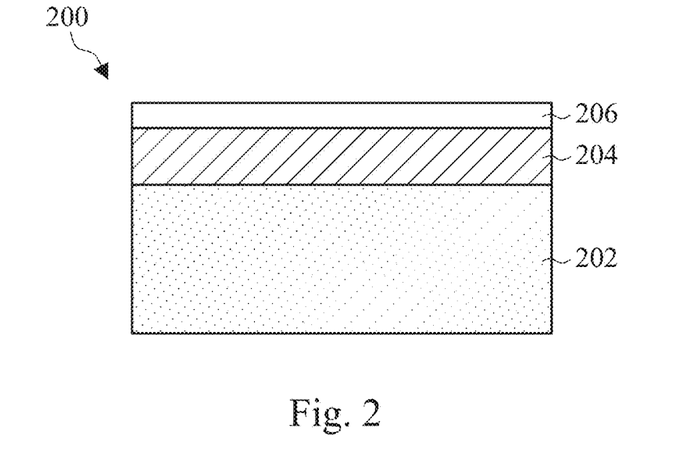
FIGS. 2-13 illustrate cross-sectional views of an embodiment of a device 200 fabricated according to one or more aspects of the method of FIG. 1.
Figure 3:
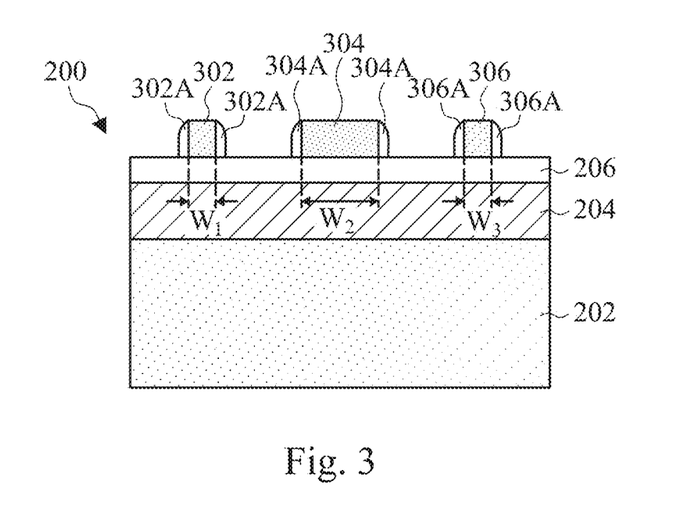

As shown in the example of FIG. 2, a first dielectric layer 204 is formed over the semiconductor substrate 202, and a second dielectric layer 206 is formed over the first dielectric layer 204. In some embodiments, the first dielectric layer 204 includes a hard mask (HM) layer formed of a suitable dielectric material, such as silicon oxide ($SiO_2$), silicon nitride ($Si_3N_4$), silicon oxynitride (SiON), a high-K dielectric material, silicon carbide, or a combination thereof. In some embodiments, the second dielectric layer 206 includes a sacrificial layer formed of a suitable material, such as polycrystalline-Si, amorphous Si, $SiO_2$, SiON, $Si_3N_4$, a high-K dielectric material, or a combination thereof. In various embodiments, each of the first and second dielectric layers 204, 206 may be deposited by a suitable deposition process, such as chemical vapor deposition (CVD), physical vapor deposition (PVD), atomic layer deposition (ALD), thermal oxidation, e-beam evaporation, or any combination thereof.

The method 100 then proceeds to block 104 where first spacers are formed to define first-stage fin regions. Referring to the example of FIG. 3, and in an embodiment of block 104, mandrels 302, 304, 306 are formed on the second dielectric layer 206. In various embodiments, the mandrels 302, 304, 306 serve as temporary support structures for the formation of spacers 302A, 304A, 306A on sidewalls of each of the mandrels 302, 304, 306, respectively. In some embodiments, the mandrels 302, 304, 306 are formed by depositing (e.g., by CVD, ALD, PVD), patterning, and etching a suitable layer such as poly-Si, Ge, SiGe, or other material. In some examples, each of the mandrels 302, 304, 306, has a width $W_1$, $W_2$, and $W_3$, respectively, that may be configured so as to provide a desired spacing between subsequently formed fin regions. In some examples, the spacers 302A, 304A, 306A disposed on the sidewalls of the mandrels 302, 304, 306 may include a dielectric material such as silicon oxide ($SiO_2$), silicon nitride ($Si_3N_4$), silicon oxynitride (SiON), a high-K dielectric material, silicon carbide, or a combination thereof. By way of example, the spacers 302A, 304A, 306A may be formed by depositing a dielectric material over the mandrels 302, 304, 306 and anisotropically etching back the dielectric material. In some embodiments, the etch-back process (e.g., for formation of the spacers 302A, 304A, 306A) may include a multiple-step etching process to improve etch selectivity and provide over-etch control. In some examples, each of the spacers 302A, 304A, 306A has a first spacer width ($W_{S1}$). In some embodiments, the first spacer width may be between about 4-25 nm. Generally, materials used for each of the mandrels and the spacers may be selected such that there exists an etch selectivity between the mandrels 302, 304, 306 and the subsequently formed spacers 302A, 304A, 306A.

Figure 4:
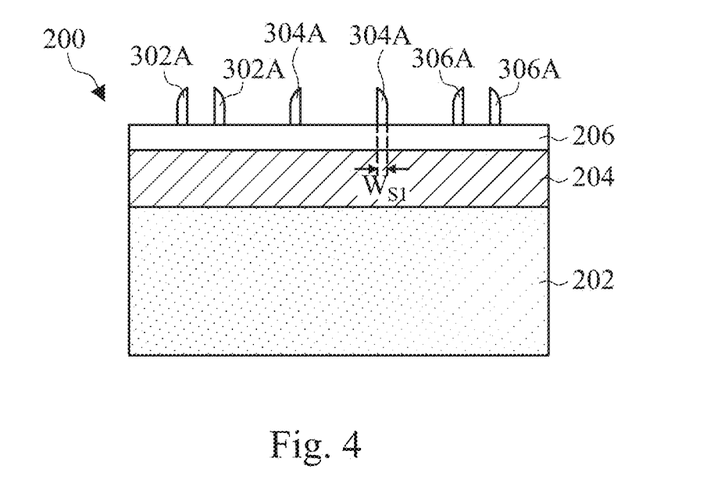
Figure 5:
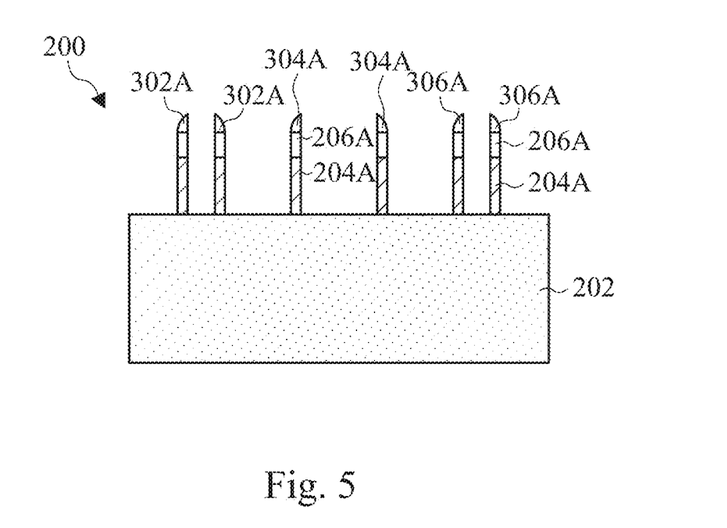

With reference to the example of FIG. 4, and in an embodiment of block 104, the mandrels 302, 304, 306 are selectively removed (e.g., by a wet or dry etching process), leaving the spacers 302A, 304A, 306A. In some embodiments, after removal of the mandrels 302, 304, 306, the spacers 302A, 304A, 306A may be used to define first-stage fin regions, as described below. For example, a pattern defined by the spacers 302A, 304A, 306A may be transferred onto one or more underlying layers (e.g., the first and second dielectric layers 204, 206), by etching such underlying layers, to form a first fin region of a plurality of fin regions, in accordance with embodiments of the present disclosure.

Figure 6:
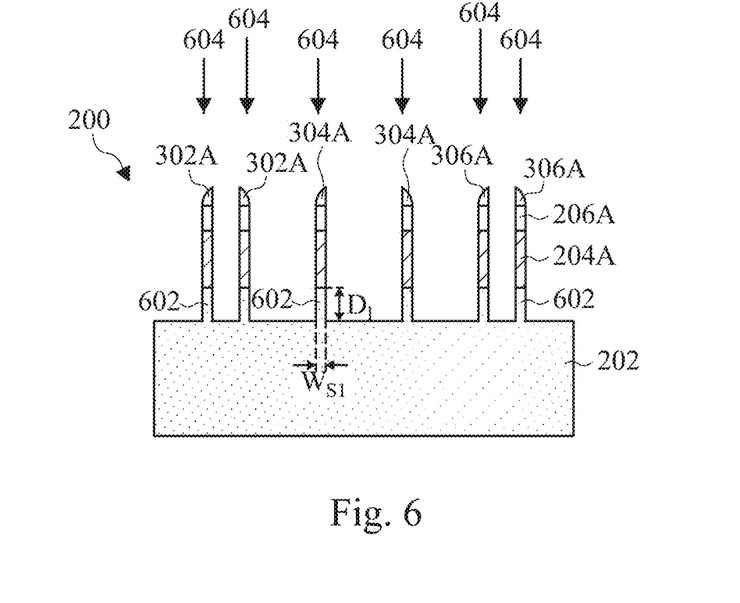
Figure 7:
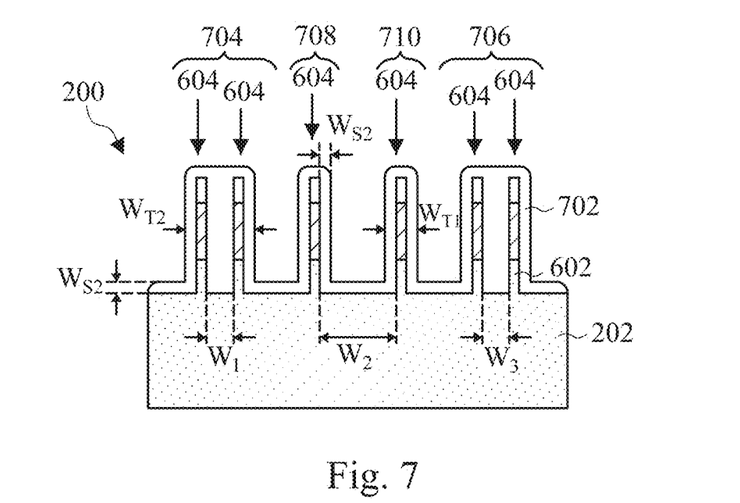

The method 100 then proceeds to block 106 where the hard mask (HM) layer is etched and the first-stage fin regions are formed as defined by the first spacers. Referring first to the example of FIG. 5, and in an embodiment of block 106, the first and second dielectric layers 204, 206 are etched (e.g., by a wet or dry etch). As shown, the spacers 302A, 304A, 306A serve as an etch mask and the pattern defined by the spacers 302A, 304A, 306A is transferred to the underlying etched dielectric layers 204, 206, resulting in a first dielectric layer portion 204A and a second dielectric layer portion 206A on the first dielectric layer portion 204A. Thereafter, with reference to the example of FIG. 6, and in an embodiment of block 106, the substrate 202 is etched (e.g., by a wet or dry etch) to form a plurality of first-stage fin regions 602, where the spacers 302A, 304A, 306A serve as an etch mask and the pattern defined by the spacers 302A, 304A, 306A is transferred to the substrate 202. In some embodiments, the plurality of first-stage fin regions 602 is formed by etching the substrate 202 to a depth ($D_1$) of about 20 nm to 70 nm. In some examples, each of the first-stage fin regions 602 defines a channel region of a FinFET device, as described below. Thus, as shown in FIG. 6, a plurality of fin stacks 604 is formed, where each of the plurality of fin stacks 604 includes the first-stage fin region 602, the first dielectric layer portion 204A on the first-stage fin region 602, the second dielectric layer portion 206A on the first dielectric layer portion 204A, and a spacer (e.g., one of the spacers 302A, 304A, 306A) over the second dielectric layer portion 206A. Additionally, in some embodiments, each of the plurality of fin stacks 604 has a fin width equal to about the first spacer width ($W_{S1}$), as the spacers 302A, 304A, 306A are used as a mask to pattern underlying features, as described above. Thus, in some embodiments, each of the plurality of fin stacks 604 has a fin width between about 4-25 nm.

The method 100 then proceeds to block 108 where second spacers are formed to define second-stage fin regions. Referring to the example of FIG. 7, in an embodiment of block 108, a spacer material 702 is formed over the substrate 202. In particular, in various examples, the spacer material 702 is formed over each of the plurality of fin stacks 604. In some examples, the spacer material 702 includes a conformal film deposited (e.g., by ALD, CVD, or PVD) over each of the plurality of fin stacks 604. The spacer material 702, like the spacers 302A, 304A, 306A, may include a dielectric material such as silicon oxide ($SiO_2$), silicon nitride ($Si_3N_4$), silicon oxynitride (SiON), a high-K dielectric material, silicon carbide, or a combination thereof. As shown, and in some embodiments, the spacers 302A, 304A, 306A may be selectively removed prior to formation of the spacer material 702. In some examples, the spacer material 702 has a second spacer width ($W_{S2}$). In some embodiments, the second spacer width may be between about 2-15 nm. Thus, in some examples, such as in region 708 and region 710, a first total fin width ($W_{T1}$) may be defined as a sum of the width of an individual fin stack 604 (i.e., width $W_{S1}$) and twice the width of the second spacer (i.e., $2 \times W_{S2}$) to account for the spacer material 702 formed on each sidewall of the fin stack 604. In some cases, when adjacent fin stacks of the plurality of fin stacks 604 are close to one another (e.g., as in region 704 and region 706), then the spacer material 702 formed over individual, neighboring fin stacks may merge together. In such cases, a second total fin width ($W_{T2}$) may be defined as a sum of the width of an individual fin stacks 604 (i.e., $2 \times W_{S1}$), twice the width of the second spacer (i.e., $2 \times W_{S2}$) to account for the spacer material 702 formed on the outermost sidewalls of the fin stacks 604 in regions 704, 706, and the spacing between the fin stacks 604 (i.e. $W_1$, $W_3$), as defined by the mandrels 302, 306 and discussed above. In general, for a plurality of N individual, neighboring fin stacks, a total fin width ($W_{TN}$) may be defined as a sum of the width of the plurality of N individual fin stacks 604 (i.e., $N \times W_{S1}$), twice the width of the second spacer (i.e., $2 \times W_{S2}$) to account for the spacer material 702 formed on the outermost sidewalls of the N fin stacks 604, and the spacing between the N fin stacks 604. In addition, in some embodiments, the spacing $W_2$ between adjacent fins (in neighboring regions 708, 710) is greater than about 1.5 times the spacing $W_1$ or $W_3$ between adjacent fins (in regions 704 or 706). In some examples, the approximately 1.5 times larger $W_2$ spacing ensures that the spacer material 702 formed on sidewalls of adjacent fins (e.g., in neighboring regions 708, 710) remain physically separated, while the spacer material 702 formed on sidewalls of adjacent fins that are more closely spaced (e.g., having a spacing $W_1$, $W_3$) as in regions 704, 706 are physically merged together. In some embodiments, a fin pitch for adjacent fins in regions 704, 706 may be less than about 35 nm.

Figure 8:
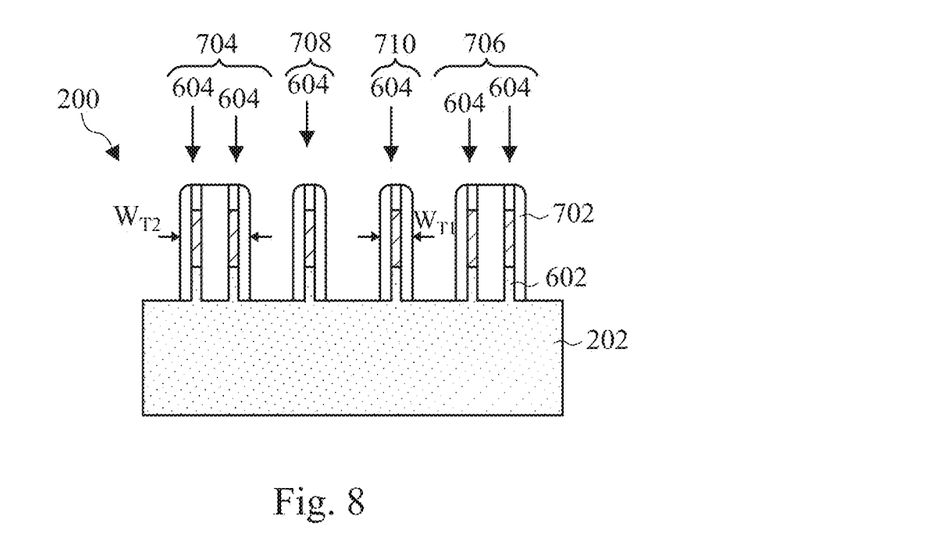
Figure 9:
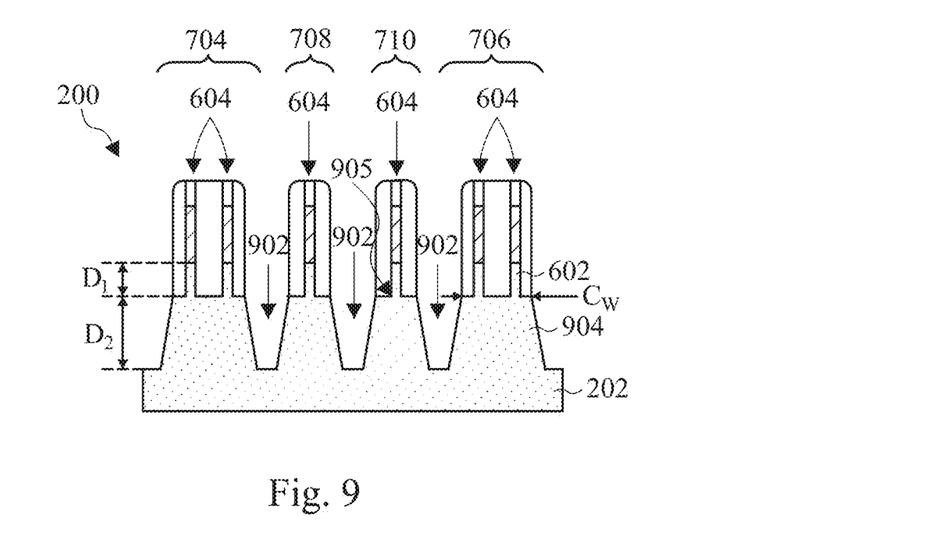
Figure 10:
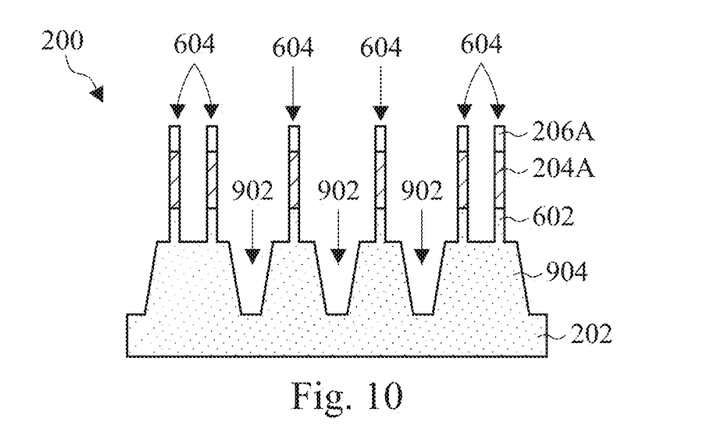

In a further embodiment of block 108, and with reference to the example of FIG. 8, the spacer material 702 is etched. In some embodiments, the spacer material 702 is anisotropically etched. In various examples, etching of the spacer material 702 may include a multiple-step etching process to improve etch selectivity and provide over-etch control. In some embodiments, the etching of the spacer material 702 removes the spacer material 702 between each of the regions 704, 706, 708, 710, revealing the underlying substrate material 202. Additionally, as shown in FIG. 8, etching of the spacer material 702 may remove the spacer material 702 from a top surface of each of the fin stacks 604. In particular, etching of the spacer material 702 between each of the regions 704, 706, 708, 710 is performed in preparation of formation of second-stage fin regions, as discussed below.

The method 100 then proceeds to block 110 where second-stage fin regions, as defined by the first-stage fin regions and second spacers, are formed. Referring to the example of FIG. 9, in an embodiment of block 110, a plurality of trenches 902 are formed within the substrate 202. In various embodiments, the plurality of trenches 902 are formed by etching (e.g., by a wet or dry etch) the substrate 202. In particular, etching of the substrate 202 to form the plurality of trenches 902 also serves to form a plurality of second-stage fin regions 904. In some embodiments, the isotropy of the etch used to form the trenches 902 may be tuned in order to provide a desired fin profile (i.e., fin angle) of the second-stage fin regions 904. In various embodiments, the one or more fin stacks 604 and spacer material 702 (e.g., on sidewalls of fin stacks 604) in each of the regions 704, 706, 708, 710 serve as etch masks for formation of the trenches 902. In particular, the width of the second-stage fin regions 904 is defined by the first total fin width (e.g., $W_{T1}$ in regions 708, 710), the second total fin width (e.g., $W_{T2}$ in regions 704, 706), or in general by a total fin width ($W_{TN}$) as described above. In some examples, a ratio of the width of a second-stage fin region 904 to a first-stage fin region 602 is greater than about 1.2, for example at an interface 905 between the first- and second-stage fin regions. In some examples, such a width ratio between the second-stage fin region 904 and the first-stage fin region 602 provides an additional contact landing region for subsequent source/drain formation, which for example, helps to lower contact resistance. In particular, in various embodiments, the width of a second-stage fin region 904 defines a contact landing width ($C_w$). Embodiments of the present disclosure advantageously provide a wide source/drain contact landing width ($C_w$). As shown and discussed in more detail below with reference to FIG. 14C, by providing a large contact landing margin, deployment of strained layers on fin structures is easier and source/drain contact resistance can be reduced.

In some embodiments, the plurality of trenches 902, and thus the plurality of second-stage fin regions 904, is formed by etching the substrate 202 by a depth ($D_2$) of about 10 nm to 300 nm. Moreover, use of the previously patterned features (i.e., fin stacks 604 and spacer material 702) as a mask to pattern subsequent features (i.e., trenches 902 and second-stage fin regions 904), enables formation of self-aligned, multi-stage fins. Fabrication of the device 200, which may include a FinFET device, using such a self-aligned process serves to mitigate at least some of the problems associated with lithographic patterning of highly-scaled structures and devices. In a further embodiment of block 110, and with reference to the example of FIG. 10, the spacer material 702 on the sidewalls of each of the fin stacks 604 is selectively removed (e.g., by a wet or dry etching process), leaving the fin stacks 604 (including the first-stage fin regions 602) and the second-stage fin regions 904.

The method 100 then proceeds to block 112 where isolation regions are formed. In some embodiments, the isolation regions formed may include one or more shallow trench isolation (STI) features. Referring to the example of FIG. 11, in an embodiment of block 112, a dielectric 1102 is deposited over the substrate 202, filling the trenches 902 with the dielectric 1102 and thereby isolating neighboring fin stacks 604. In some embodiments, the dielectric 1102 used to form the isolation regions includes $SiO_2$, silicon nitride, silicon oxynitride, fluorine-doped silicate glass (FSG), a low-k dielectric, other suitable materials, or combinations thereof, and/or other suitable material known in the art. The dielectric 1102 used in the formation of the isolation regions may be deposited by CVD, ALD, PVD, or other suitable process. In some embodiments, the dielectric 1102 used in the formation of the isolation regions is annealed to improve the quality of the dielectric. In some embodiments, a field oxide, a LOCOS feature, and/or other suitable isolation features may be implemented on and/or within the substrate. However, other embodiments are possible. For example, in some embodiments, the isolation regions may include a multi-layer structure, for example, having one or more liner layers.

Figure 11:
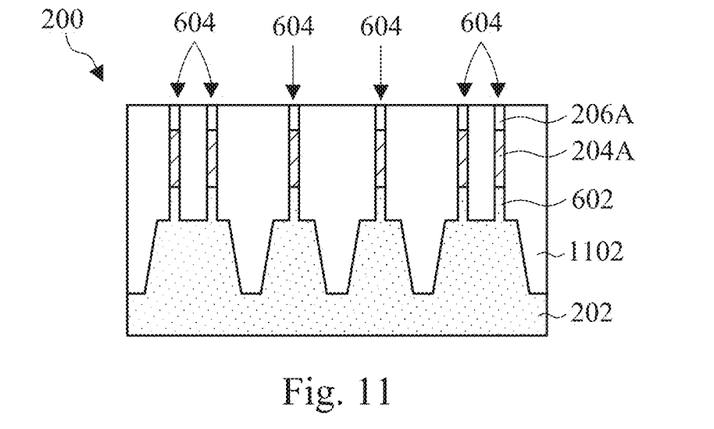

In a further embodiment of the block 112, again with reference to the example of FIG. 11, the dielectric 1102 used to form the isolation regions is thinned and planarized, for example by a CMP process. For example, a CMP process may be performed to remove excess dielectric 1102 material (used to form the isolation regions) and planarize a top surface of the semiconductor device 200. In some embodiments, the isolation regions are configured to isolate fin active regions (e.g., fins 604). In some embodiments, the isolation regions interposing the fins 604 may include a multi-layer structure, for example, having one or more liner layers.

The method 100 then proceeds to block 114 where the isolation regions are recessed. In some embodiments, the recessing process may include a dry etching process, a wet etching process, and/or a combination thereof. Referring to the example of FIG. 12, the dielectric material 1102 around the each of the fins 604A is recessed to laterally expose an upper portion of the first-stage fin regions 602. In some embodiments, a recessing depth is controlled (e.g., by controlling an etching time) so as to result in a desired height 'H' of the exposed upper portion.

Figure 12:
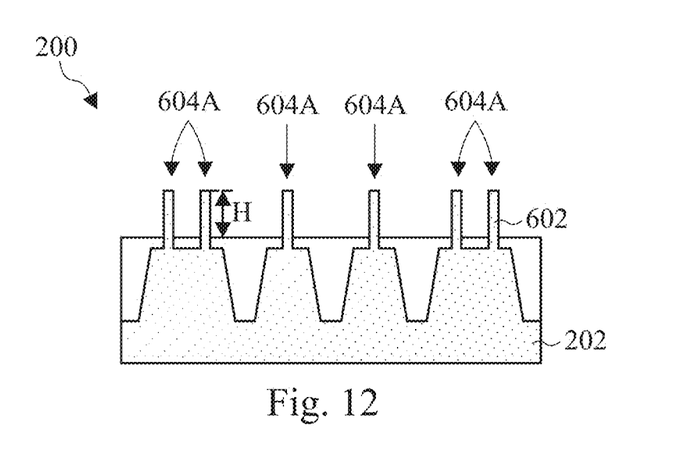

In an additional embodiment of block 114, the first dielectric layer portion 204A and the second dielectric layer portion 206A (FIG. 11) are removed from the fin stacks 604, leaving the fins 604A described above. In some examples, removal of the first and second dielectric layer portions 204A, 206A may be performed prior to recessing the isolation regions. In some cases, removal of the first and second dielectric layer portions 204A, 206A may be performed after recessing the isolation regions. In some embodiments, removal of the first and dielectric second dielectric layer portions 204A, 206A includes removal of a hard mask (HM) layer and a sacrificial layer, described above. Removal of the first and dielectric second dielectric layer portions 204A, 206A may be performed by using a suitable etching process (e.g., dry or wet etching). In some embodiments, a CMP process may be performed to remove the first and dielectric second dielectric layer portions 204A, 206A and planarize the top surface of the semiconductor device 200. In any case, the example of FIG. 12 illustrates the semiconductor device 200 after recessing the dielectric material 1102, to form isolation regions (e.g., STI isolation regions) and after removal of the first and dielectric second dielectric layer portions 204A, 206A.

In some embodiments, a well implant may also be performed (e.g., into one or both of the first- and second-stage fin regions 602, 904) using an ion implantation process and employing a suitable N-type or P-type dopant. Alternatively, in some embodiments, one or both of the first- and second-stage fin regions 602, 904 may include one or more epitaxially-grown, doped layers. In some embodiments, the first- and second-stage fin regions 602, 904 may include both N-type and P-type fins, where each of the N- and P-type fins is implanted using separate process steps. By way of example, an N-type dopant may include arsenic, phosphorous, antimony, or other N-type donor material. In other examples, a P-type dopant may include boron, aluminum, gallium, indium, or other P-type acceptor material. In some embodiments, N-type or P-type dopants may be used to perform anti-punch through (APT) ion implantation into one or both of the first- and second-stage fin regions 602, 904. In some examples, other ion implantation processes may also be performed into one or both of the first- and second-stage fin regions 602, 904, including a threshold voltage ($V_t$) adjust implant, a halo implant, a well implant, or other suitable implant.

It should be noted that the first- and second-stage fin regions 602, 904, like the substrate 202, may comprise silicon or another elementary semiconductor such as germanium (Ge), silicon carbide (SiC), silicon germanium (SiGe), or diamond. Alternatively, the first- and second-stage fin regions 602, 904 may include a compound semiconductor and/or an alloy semiconductor. By way of example, in some embodiments, the first- and second-stage fin regions 602, 904 may also include silicon phosphide (SiP), silicon phosphorus carbide (SiPC), a silicon-on-insulator (SOI) structure, a SiGe-on-SOI structure, a Ge-on-SOI structure, a III-VI material, or a combination of any of the above materials. Further, the first- and second-stage fin regions 602, 904 may optionally include an epitaxial layer (epi-layer), may be strained for performance enhancement, and/or have other suitable enhancement features.

The method 100 then proceeds to block 116 where a gate stack is formed. In an embodiment of block 116, with reference to FIG. 13, high-K/metal gate stacks 1302, 1304 may be deposited and patterned on the device 200. In some embodiments, the high-K/metal gate stacks 1302, 1304 include an interfacial layer formed over the exposed portions of the first-stage fin regions 602 (which includes a FinFET channel region), a high-K gate dielectric layer formed over the interfacial layer, and a metal layer formed over the high-K gate dielectric layer. High-K gate dielectrics, as used and described herein, include dielectric material having a high dielectric constant, for example, greater than that of thermal silicon oxide (~3.9). The metal layer used within high-K/metal gate stack may include a metal, metal alloy, or metal silicide. Additionally, the formation of the high-K/metal gate stacks 1302, 1304 includes depositions to form various gate materials and one or more CMP processes to remove excessive gate materials and thereby planarize a top surface of the semiconductor device 200.

Figure 13:
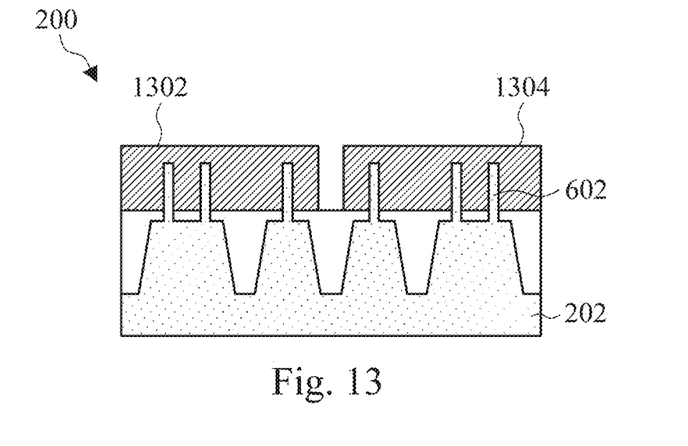

In various embodiments, the interfacial layer of the high-K/metal gate stacks 1302, 1304 may include a dielectric material such as silicon oxide ($SiO_2$), HfSiO, or silicon oxynitride (SiON). The interfacial layer may be formed by chemical oxidation, thermal oxidation, atomic layer deposition (ALD), chemical vapor deposition (CVD), and/or other suitable method. The gate dielectric layer of the high-K/metal gate stacks 1302, 1304 may include a high-K dielectric layer such as hafnium oxide ($HfO_2$). Alternatively, the gate dielectric layer of the high-K/metal gate stacks 1302, 1304 may include other high-K dielectrics, such as $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), combinations thereof, or other suitable material. The high-K gate dielectric layer of the high-K/metal gate stacks 1302, 1304 may be formed by ALD, physical vapor deposition (PVD), CVD, oxidation, and/or other suitable methods. The metal layer of the high-K/metal gate stacks 1302, 1304 may include a single layer or alternatively a multi-layer structure, such as various combinations of a metal layer with a selected work function to enhance the device performance (work function metal layer), liner layer, wetting layer, adhesion layer, metal alloy or metal silicide. By way of example, the metal layer of the high-K/metal gate stacks 1302, 1304 may include Ti, Ag, Al, TiAlN, TaC, TaCN, TaSiN, Mn, Zr, TiN, TaN, Ru, Mo, Al, WN, Cu, W, Re, Ir, Co, Ni, other suitable metal materials or a combination thereof. In addition, the metal layer may provide an N-type or P-type work function, may serve as a transistor (e.g., FinFET) gate electrode, and in at least some embodiments, the metal layer 114 may include a polysilicon layer. In various embodiments, the metal layer of the high-K/metal gate stacks 1302, 1304 may be formed by ALD, PVD, CVD, e-beam evaporation, or other suitable process. Further, the metal layer of the high-K/metal gate stacks 1302, 1304 may be formed separately for N-FET and P-FET transistors which may use different metal layers. In various embodiments, a CMP process may be performed to remove excessive metal from the metal layer of the high-K/metal gate stacks 1302, 1304, and thereby provide a substantially planar top surface of the metal layer of the high-K/metal gate stacks 1302, 1304.

The semiconductor device 200 may undergo further processing to form various features and regions known in the art. For example, subsequent processing may sidewall spacers (e.g., on the high-K/metal gate stacks 1302, 1304), source/drain features (e.g., epitaxially grown source/drain features), etch stop layer(s), interlayer dielectric (ILD) layer(s), contact openings, contact metal, as well as various contacts/vias/lines and multilayers interconnect features (e.g., metal layers and interlayer dielectrics) on the substrate 202, configured to connect the various features to form a functional circuit that may include one or more FinFET devices. In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multi-layer interconnection structure. Moreover, additional process steps may be implemented before, during, and after the method 100, and some process steps described above may be replaced or eliminated in accordance with various embodiments of the method 100.

Figure 14A:
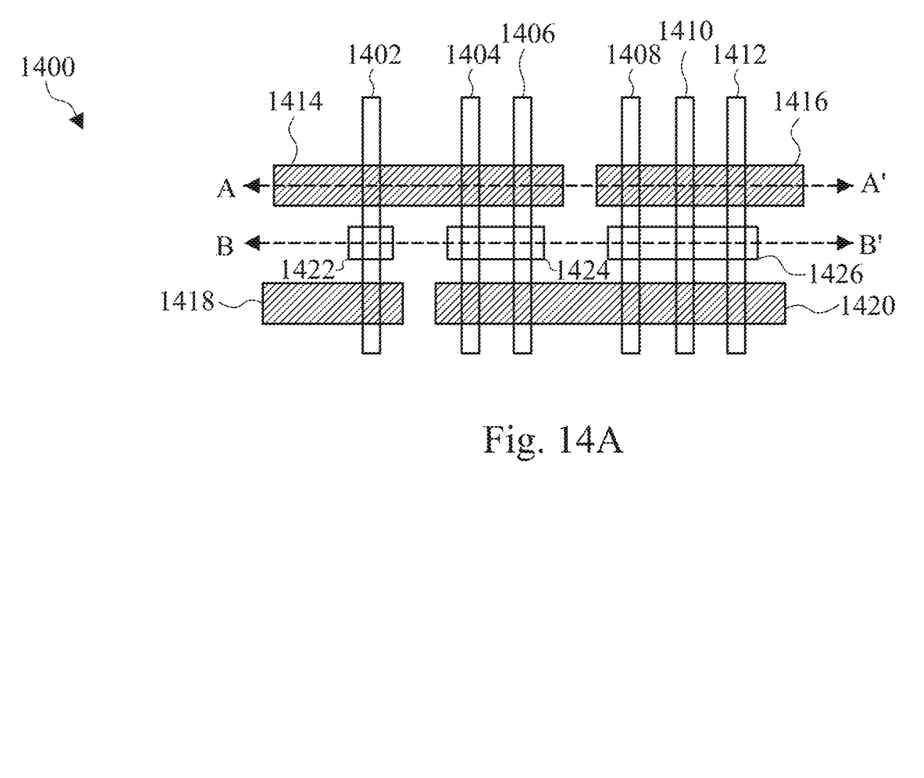
FIG. 14A illustrates a top-down view of a device fabricated in accordance with one or more of the steps of the method of FIG. 1.
Figure 14B:
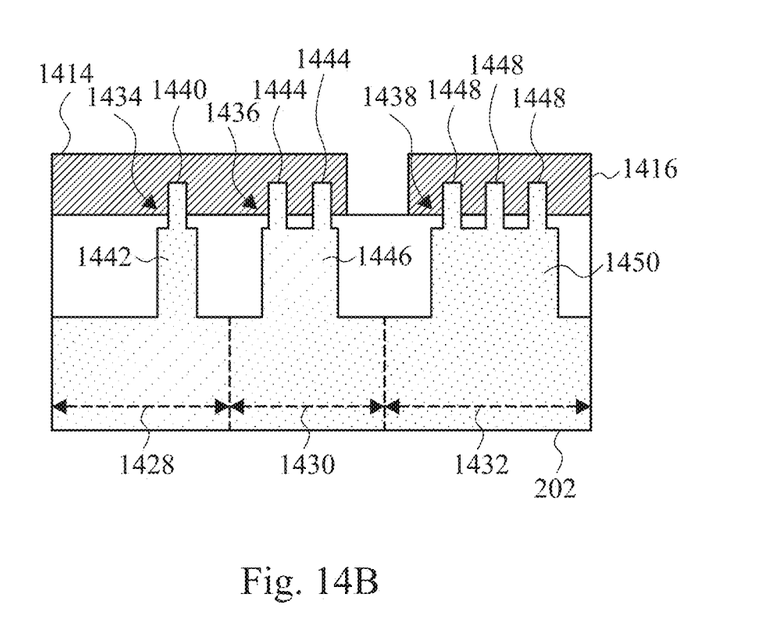
FIG. 14B illustrates a cross-sectional view of a device along a plane substantially parallel to section AA' of FIG. 14A.
Figure 14C:
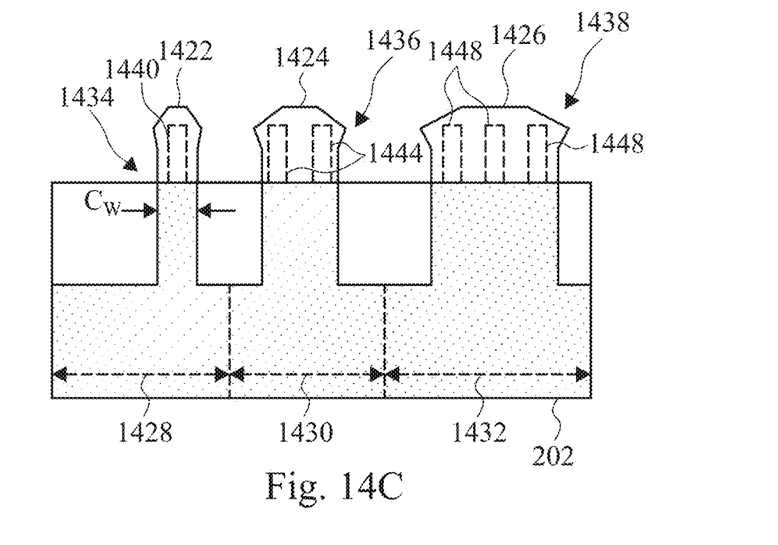
FIG. 14C illustrates a cross-sectional view of a device along a plane substantially parallel to section BB' of FIG. 14A.

Referring now to FIGS. 14A-14C, therein is illustrated a FinFET device 1400 fabricated in accordance with one or more of the steps of the method 100. In particular, FIG. 14A illustrates a top-down view of the FinFET device 1400 including a plurality of fins 1402, 1404, 1406, 1408, 1410, 1412. FIG. 14A also shows a plurality of high-K/metal gate stacks 1414, 1416, 1418, 1420, and a plurality of source/drain features 1422, 1424, 1426. It will be understood that each of the plurality of high-K/metal gate stacks and source/drain features are formed over one or more of the plurality of fins, according to one or more methods described herein and/or as known in the art. Additionally, a fin channel region (i.e., FinFET channel region) is disposed within each of the plurality of fins, underlying the high-K/metal gate stacks. It is noted that the plurality of fins 1402, 1404, 1406, 1408, 1410, 1412, the plurality of high-K/metal gate stacks 1414, 1416, 1418, 1420, and the plurality of source/drain features 1422, 1424, 1426 are shown merely for purposes of illustration. In some embodiments, there may be more or less of each of the fins, high-K/metal gate stacks, or source/drain features. Examples of the various embodiments provided herein are illustrative, and are not meant to be limiting in any way, beyond the language recited in the claims below.

As shown in FIG. 14A, one or more of the plurality of fins 1402, 1404, 1406, 1408, 1410, 1412 may share a common high-K/metal gate stack and/or a common source/drain feature. For example, fins 1402, 1404, 1406 share a common high-K/metal gate stack 1414, fins 1408, 1410, 1412 share a common high-K/metal gate stack 1416, fins 1404, 1406, 1408, 1410, 1412 share a common high-K/metal gate stack 1420, fins 1404, 1406 share a common source/drain feature 1424, and fins 1408, 1410, 1412 share a common source/drain feature 1426.

With reference now to FIGS. 14B and 14C, FIG. 14B illustrates a cross-sectional view of the FinFET device 1400 along a plane substantially parallel to section AA' of FIG. 14A, and FIG. 14C illustrates a cross-sectional view of the FinFET device 1400 along a plane substantially parallel to section BB' of FIG. 14A. The FinFET device 1400 is formed on a substrate 202 having well regions 1428, 1430, 1432. Each of the well regions 1428, 1430, 1432 may include an N-type or P-type well region. In some embodiments, incorporation of one or more dopants into each of the well regions 1428, 1430, 1432 may be performed by ion implantation, in situ epitaxial growth, or other method as known in the art. As shown in FIG. 14B, the device 1400 may include one or more multi-stage fin elements 1434, 1436, 1438. In various embodiments, each of the more multi-stage fin elements 1434, 1436, 1438 may be formed in accordance with one or more steps of the method 100, described above. By way of example, multi-stage fin element 1434 includes a first-stage fin region 1440 formed over a second-stage fin region 1442, multi-stage fin element 1436 includes first-stage fin regions 1444 formed over a second-stage fin region 1446, and multi-stage fin element 1438 includes first-stage fin regions 1448 formed over a second-stage fin region 1450.

In some embodiments, doping of each of the multi-stage fin elements 1434, 1436, 1438 may be performed as described above and/or may be similar to a process used to dope the well regions 1428, 1430, 1432 and may include ion implantation, in situ doped epitaxial growth, or other method as known in the art. In general, doping of the multi-stage fin elements 1434, 1436, 1438 and the well regions 1428, 1430, 1432 may be performed for a variety of purposes in addition to well doping, such as to form a doped APT layer, to form a doped threshold voltage ($V_t$) adjust layer, to form a doped halo layer, or to form another suitable doped layer within the device 1400. Merely for purposes of illustration, consider that the well regions 1428 and 1432 include P-type well regions, and the well region 1430 includes an N-type well region. In such an example, FinFET devices formed in the multi-stage fin elements 1434 and 1438 may include N-type FinFETs, and FinFET devices formed in the multi-stage fin element 1436 may include P-type FinFETs. Various other doping and device configurations may also be employed as known in the art.

In addition, with reference to FIG. 14B, high-K/metal gate stacks may be deposited and patterned on the device 1400, such that they are formed over exposed portions of the first-stage fin regions. For example, in various embodiments, the FinFET device 1400 includes the high-K/metal gate stack 1414 formed over the exposed portions of the first-stage fin regions 1440, 1444, and the high-K/metal gate stack 1416 formed over the exposed portions of the first-stage fin regions 1448. As discussed above, the first-stage fin regions 1440, 1444, 1448 may include a FinFET channel region. Similar to the example discussed with reference to FIG. 13, each of the high-K/metal gate stacks 1414, 1416 (as well as gate stacks 1418, 1420) may include an interfacial layer formed over the first-stage fin region, a high-K gate dielectric layer formed over the interfacial layer, and a metal layer formed over the high-K gate dielectric layer. The materials used for each of the interfacial layer, the high-K gate dielectric, and the metal layer, and the formation of such layers, may be similar as to that described above with reference to FIG. 13. In some embodiments, sidewall spacers may be formed on sidewalls of each of the high-K/metal gate stacks 1414, 1416 (as well as gate stacks 1418, 1420). In some examples, such sidewall spacers may include a dielectric material such as silicon oxide, silicon nitride, silicon carbide, silicon oxynitride, or combinations thereof.

With reference to FIG. 14C, illustrated therein is a cross-sectional view of the FinFET device 1400 along a plane substantially parallel to section BB' of FIG. 14A. As shown, the FinFET device 1400 may include the source/drain regions 1422, 1424, 1426 formed within, on, and/or around each of the exposed portions of the first-stage fin regions 1440, 1444, 1448. In various examples, a source or drain region, such as source/drain regions 1452, 1454, 1456, is formed adjacent to and on either side of a device channel region (e.g., which underlies a high-K/metal gate stack). In some embodiments, the source/drain regions 1452, 1454, 1456 may be epitaxially grown. In some examples, for example when adjacent first-stage fin regions are close to one another (e.g., as in first-stage fin regions 1444, 1448), a single common source/drain region may be in contact with each of the plurality of adjacent first-stage fin regions. For example, as shown in FIG. 14C, the common source/drain region 1424 is in contact with each of the plurality of first-stage fin regions 1444, and the common source/drain region 1426 is in contact with each of the plurality of first-stage fin regions 1448. In particular, embodiments of the present disclosure provide a wide source/drain contact landing width ($C_w$). As discussed above, the contact landing width ($C_w$) (or contact landing margin) may be equal to about a total width ($W_{T1}$, $W_{T2}$, $W_{TN}$) of the second-stage fin region. By providing a large contact landing margin, deployment of strained layers on fin structures is easier and source/drain contact resistance can be reduced.

With respect to the description provided herein, the present disclosure offers methods and structures for forming a multi-stage fin profile which avoids many of the pitfalls of current processing techniques, including misalignment of critical features, difficulty of deployment of strained layers on narrow fin structures, and narrow contact landing margins which can lead to increased contact resistance, among others. Embodiments of the present disclosure advantageously provide a wide source/drain contact landing width ($C_w$), making the deployment of strained layers on fin structures easier and enabling the reduction of source/drain contact resistance. Additionally, embodiments disclosed herein provide a self-aligned process for the formation of second-stage fin regions (e.g., second-stage fin regions 904), which reduces cost by eliminating at least one photolithography step. Further, the self-aligned fin formation methods described herein provides for fin profiles that are easy to control (e.g., in terms of CD and fin angle) due to shallower fin shape (i.e., first step fin width). Embodiments discussed herein also provide for a fully symmetric fin shape for the second-stage fin line. Those of skill in the art will readily appreciate that the methods and structures described herein may be applied to a variety of other semiconductor devices to advantageously achieve similar benefits from such other devices without departing from the scope of the present disclosure.

Thus, one of the embodiments of the present disclosure described a method for fabricating a semiconductor device (e.g., a FinFET device) having a multi-stage fin profile. In some embodiments, the method includes providing a substrate and forming a first spacer having a first spacer width over the substrate. In various examples, the first spacer masks a first portion of the substrate during a first etch process to define a first-stage fin region. By way of example, the first etch process is performed on the substrate to form the first-stage fin region, where a width of the first-stage fin region is substantially equal to about the first spacer width. In some embodiments, a second spacer having a second spacer width is formed over the substrate, where the second spacer and the first-stage fin region mask a second portion of the substrate during a second etch process to define a second-stage fin region. In some examples, the second etch process is performed on the substrate to form the second-stage fin region, where a width of the second-stage fin region is greater than the width of the first-stage fin region.

In another of the embodiments, discussed is a method where a substrate including at least one dielectric layer deposited over the substrate is provided. In some examples, a mandrel is formed on the at least one dielectric layer and a pair of first spacers each having a first spacer width are formed on sidewalls of the mandrel. In various examples, the mandrel is selectively etched such that the pair of first spacers remain on the at least one dielectric layer. In some embodiments, the at least one dielectric layer and the substrate are etched to form a pair of first-stage fin regions, where a width of the first-stage fin regions is equal to about the first spacer width. By way of example, a second spacer having a second spacer width is formed on sidewalls of each of the pair of first-stage fin regions. Thereafter, in various embodiments, the substrate is etched to form a second-stage fin region, where a width of the second-stage fin region is greater than the width of the first-stage fin region.

In yet another of the embodiments, discussed is a semiconductor device including a substrate, a first-stage of a multi-stage fin formed over the substrate, and a second-stage of the multi-stage fin formed over the first-stage. The first-stage of the multi-stage fin has a first width. In various examples, the second-stage of the multi-stage fin has a second width less than the first width. In some embodiments, the second-stage of the multi-stage fin includes a plurality of fin elements, and a common source/drain region is formed in contact with each of the plurality of fin elements.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of semiconductor device fabrication, comprising:
    forming a first spacer having a first spacer width over a substrate, wherein the first spacer masks a first portion of the substrate during a first etch process to define a first-stage fin region;
    performing the first etch process on the substrate to form the first-stage fin region, wherein a width of the first-stage fin region is substantially equal to about the first spacer width;
    forming a second spacer having a second spacer width over the substrate, wherein forming the second spacer includes conformally depositing a spacer material over the substrate and anisotropically etching the spacer material, thereby exposing a top surface of a fin stack including the first-stage fin region, and wherein the second spacer and the exposed fin stack mask a second portion of the substrate during a second etch process to define a second-stage fin region; and
    performing the second etch process on the substrate to form the second-stage fin region, wherein a width of the second-stage fin region is greater than the width of the first-stage fin region.

2. The method of claim 1, wherein forming the second spacer includes forming the second spacer on a first and second sidewall of the first-stage fin region.

3. The method of claim 2, wherein the width of the second-stage fin region is substantially equal to about a sum of the width of the first-stage fin region and twice the second spacer width.

4. The method of claim 1, wherein a ratio of the width of the second-stage fin region to the width of the first-stage fin region, at an interface between the first- and second-stage fin regions, is greater than about 1.2.

5. The method of claim 1, wherein the first-stage fin region includes a first plurality of fins having a first spacing between adjacent fins, and wherein the first-stage fin region includes a second plurality of fins having a second spacing different than the first spacing between adjacent fins.

6. The method of claim 5, wherein the first spacing between adjacent fins is greater than about 1.5 times the second spacing between adjacent fins.

7. The method of claim 5, wherein forming the second spacer further includes forming the second spacer over each of the first and second plurality of fins, wherein the second spacer formed on sidewalls of adjacent fins of the first plurality of fins remain physically separated, and wherein the second spacer formed on sidewalls of adjacent fins of the second plurality of fins are physically merged together.

8. A method of semiconductor device fabrication, comprising:
    providing a substrate including at least one dielectric layer deposited over the substrate;
    forming a mandrel on the at least one dielectric layer and forming a pair of first spacers each having a first spacer width on sidewalls of the mandrel;
    selectively etching the mandrel such that the pair of first spacers remain on the at least one dielectric layer;
    etching the at least one dielectric layer and the substrate to form a pair of fin stacks, wherein each fin stack includes a first-stage fin region, and wherein a width of the first-stage fin region is substantially equal to about the first spacer width;
    forming a second spacer having a second spacer width on sidewalls of the first-stage fin region, wherein at least a top portion of each of the pair of fin stacks is exposed after formation of the second spacer; and
    etching the substrate to form a second-stage fin region, wherein a width of the second-stage fin region is greater than the width of the first-stage fin region.

9. The method of claim 8, wherein forming the mandrel further includes forming the mandrel having a first mandrel width that defines a first spacing between the pair of first spacers, wherein a spacing between the pair of first-stage fin regions is substantially equal to about the first spacing, and wherein the second spacer formed on sidewalls of each of the pair of first-stage fin regions remain physically separated.

10. The method of claim 9, wherein forming the mandrel further includes forming the mandrel having a second mandrel width that defines a second spacing less than the first spacing between the pair of first spacers, wherein the spacing between the pair of first-stage fin regions is substantially equal to about the second spacing, and wherein the second spacer formed on sidewalls of each of the pair of first-stage fin regions are physically merged together.

11. The method of claim 8, further comprising forming a common source/drain region in contact with each of the pair of first-stage fin regions.

12. The method of claim 8, wherein the etching the at least one dielectric layer and the substrate to form the pair of first-stage fin regions further includes etching the substrate to a depth of about 20 nm to 70 nm.

13. The method of claim 8, wherein the etching the substrate to form the second-stage fin region further includes etching the substrate to a depth of about 10 nm to 300 nm, as measured from an interface between the first- and second-stage fin regions.

14. The method of claim 8, further comprising forming an isolation region between adjacent second-stage fin regions.

15. The method of claim 8, wherein the width of the second-stage fin region is substantially equal to about a sum of the width of the pair the first-stage fin regions, twice the second spacer width, and a spacing between the pair of first-stage fin regions.

16. A method of semiconductor device fabrication, comprising:
    forming a plurality of first spacers over a substrate;
    etching a portion of the substrate to form a plurality of fin stacks by using the plurality of first spacers as an etching mask to define a plurality of first-stage fin regions;
    forming a plurality of second spacers along sidewalls of the plurality of fin stacks, wherein forming the plurality of second spacers includes depositing a spacer material over the substrate and etching the spacer material to expose a top surface of each of the plurality of fin stacks;
    etching another portion of the substrate by using the plurality of second spacers and exposed fin stacks as an etch mask to define a plurality of second-stage fin regions, wherein a width of the second-stage fin region is greater than a width of the first-stage fin region; and removing the plurality of second spacers.

17. The method of claim 16, wherein forming the plurality of first spacers over the substrate includes:

forming a plurality of mandrels over the substrate;

forming the plurality of first spacers along sidewalls of the plurality of mandrels; and removing the plurality of mandrels.

18. The method of claim 16, further comprising forming a first dielectric layer over the substrate, and wherein etching the portion of the substrate to form the plurality of fin includes etching the first dielectric layer.

19. The method of claim 18, wherein forming the plurality of second spacers along sidewalls of the plurality of fin stacks includes forming the plurality of second spacers directly on a portion of the first dielectric layer.

20. The method of claim 16, further comprising forming an isolation region between adjacent second-stage fin regions.

\* \* \* \* \*